US010416575B2

(12) United States Patent
Dattilo et al.

(10) Patent No.: US 10,416,575 B2
(45) Date of Patent: Sep. 17, 2019

(54) APPARATUS AND METHOD FOR CLEANING A PARTIAL AREA OF A SUBSTRATE

(71) Applicant: SUSS MIRCROTEC PHOTOMASK EQUIPMENT GMBH & CO, KG, Sternenfels (DE)

(72) Inventors: Davide Dattilo, Bretten (DE); Uwe Dietze, Austin, TX (US); Martin Samayoa, Corona, CA (US)

(73) Assignee: SUSS MICROTEC PHOTOMASK EQUIPMENT GMBH & CO. KG, Sternenfels (DE)

( * ) Notice: Subject to any disclaimer, the term of this patent is extended or adjusted under 35 U.S.C. 154(b) by 392 days.

(21) Appl. No.: 15/352,886

(22) Filed: Nov. 16, 2016

(65) Prior Publication Data
US 2018/0136573 A1 May 17, 2018

(51) Int. Cl.
*B24C 1/04* (2006.01)
*G03F 7/20* (2006.01)
(Continued)

(52) U.S. Cl.
CPC ............ *G03F 7/70908* (2013.01); *B08B 1/00* (2013.01); *B08B 1/001* (2013.01); *B08B 3/02* (2013.01);
(Continued)

(58) Field of Classification Search
CPC ......... B24C 1/04; G03F 7/70908; B08B 1/00; B08B 1/001; B08B 3/02; B08B 3/10;
(Continued)

(56) References Cited

U.S. PATENT DOCUMENTS 4,347,689 A * 9/1982 Hammond ................ B24B 7/16
451/307
5,209,027 A * 5/1993 Ishida .................... B24B 21/004
451/303
(Continued)

*Primary Examiner* — George B Nguyen
(74) *Attorney, Agent, or Firm* — Tarolli, Sundheim, Covell & Tummino LLP

(57) ABSTRACT

An apparatus and a method for cleaning a partial area of a substrate, in particular a photomask, are described. The apparatus has a cleaning head having a lower surface configured to be arranged above and in close proximity to the substrate area to be cleaned, the lower surface having a central opening formed therein, a first annular groove, surrounding the central opening, and at least a second groove, arranged between the first annular groove and the central opening, the first annular groove being fluidly connected to a first port allowing connection to an external supply source and the second annular groove being fluidly connected to a second port allowing connection to an external supply source, a tape supply mechanism arranged to supply an abrasive tape to the central opening in the lower surface of the cleaning head, such that a portion of the abrasive tape protrudes therefrom and a liquid media conduit having an outlet arranged to supply a liquid to a backside of the abrasive tape at or at the vicinity of the central opening. In the method a protruding portion of an abrasive tape, which protrudes from a central opening of a cleaning head is placed in contact with the area of the substrate to be cleaned to thereby bring a lower surface of the cleaning head in close proximity to the substrate area to be cleaned. A liquid is supplied to a backside of the abrasive tape at or at the vicinity of the central opening of the cleaning head, such that at least the portion of the abrasive tape protruding from the central opening is wetted, and a relative movement is caused between the abrasive tape and the surface area of the substrate to be cleaned. The method also encompasses applying a cleaning fluid to the substrate area to be cleaned (Continued)

via at least one first groove or the at least one second groove in the lower surface of the substrate and applying a suction force to the other groove.

26 Claims, 7 Drawing Sheets

(51) Int. Cl.
    *B08B 1/00*           (2006.01)
    *B08B 3/10*           (2006.01)
    *G03F 1/64*           (2012.01)
    *G03F 1/82*           (2012.01)
    *B08B 3/02*           (2006.01)

(52) U.S. Cl.
    CPC .............. *B08B 3/10* (2013.01); *B24C 1/04* (2013.01); *G03F 1/64* (2013.01); *G03F 1/82* (2013.01); *B08B 2203/0229* (2013.01)

(58) Field of Classification Search
    CPC . B08B 2203/0229; B24B 21/14; B24B 21/12; B24B 55/02
    USPC .............................................. 451/59, 53, 168
    See application file for complete search history.

(56) References Cited

U.S. PATENT DOCUMENTS

| | | | | |
|---|---|---|---|---|
| 5,573,444 A * | 11/1996 | Ryoke | ............... | B24B 21/004 451/28 |
| 5,643,044 A * | 7/1997 | Lund | ............... | B24B 21/00 451/168 |
| 5,733,178 A * | 3/1998 | Ohishi | ............... | B24D 11/00 451/41 |
| 5,733,181 A * | 3/1998 | Hasegawa | ............... | B24B 9/065 451/168 |
| 5,791,969 A * | 8/1998 | Lund | ............... | B24B 21/00 451/289 |
| 5,820,446 A * | 10/1998 | Lu | ............... | B24B 7/17 451/37 |
| 2002/0190737 A1* | 12/2002 | Maekawa | ............... | B08B 1/00 324/758.04 |
| 2009/0264053 A1* | 10/2009 | Manens | ............... | B24B 9/065 451/59 |
| 2010/0003900 A1* | 1/2010 | Sakaguchi | ............... | B24B 19/26 451/59 |

* cited by examiner

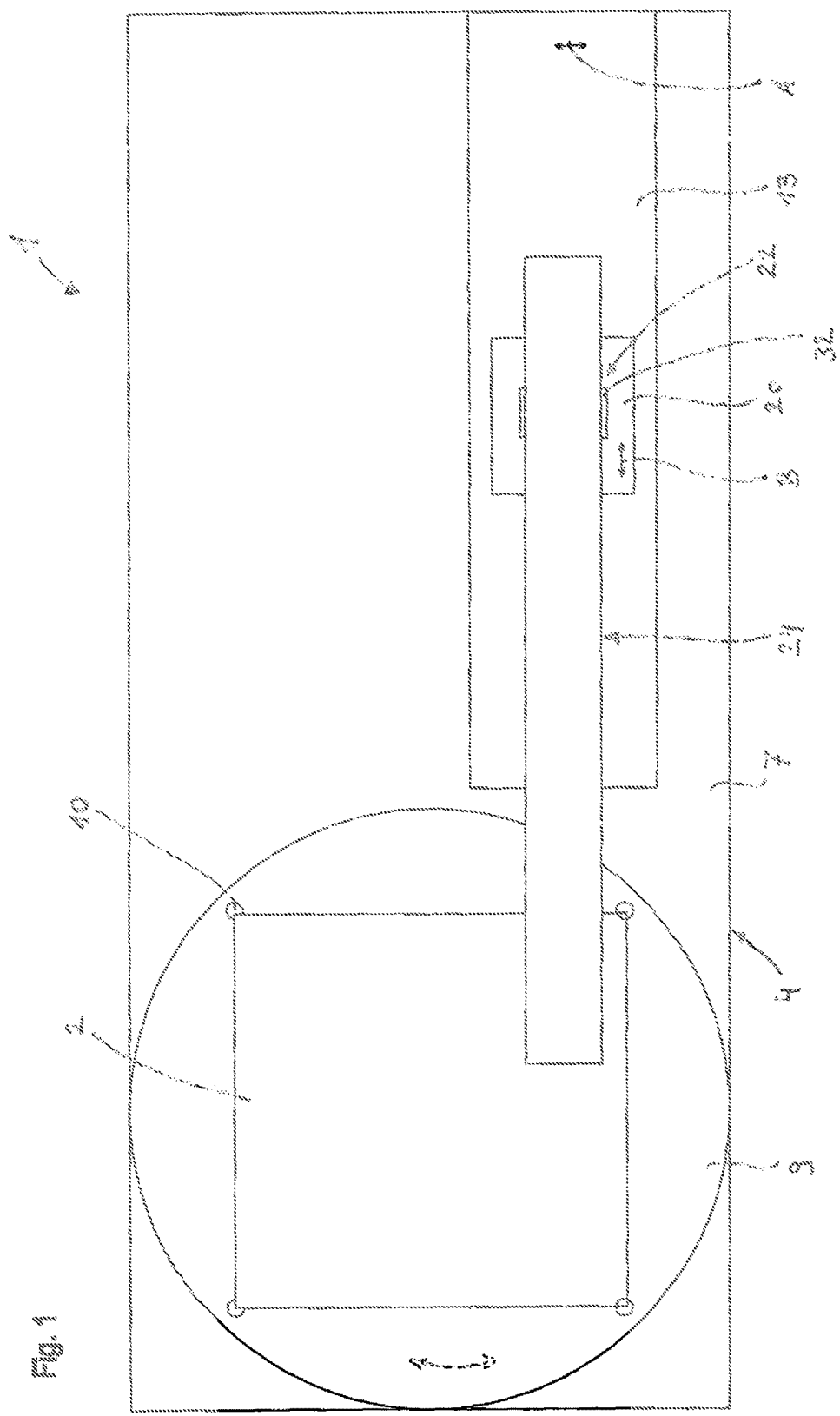

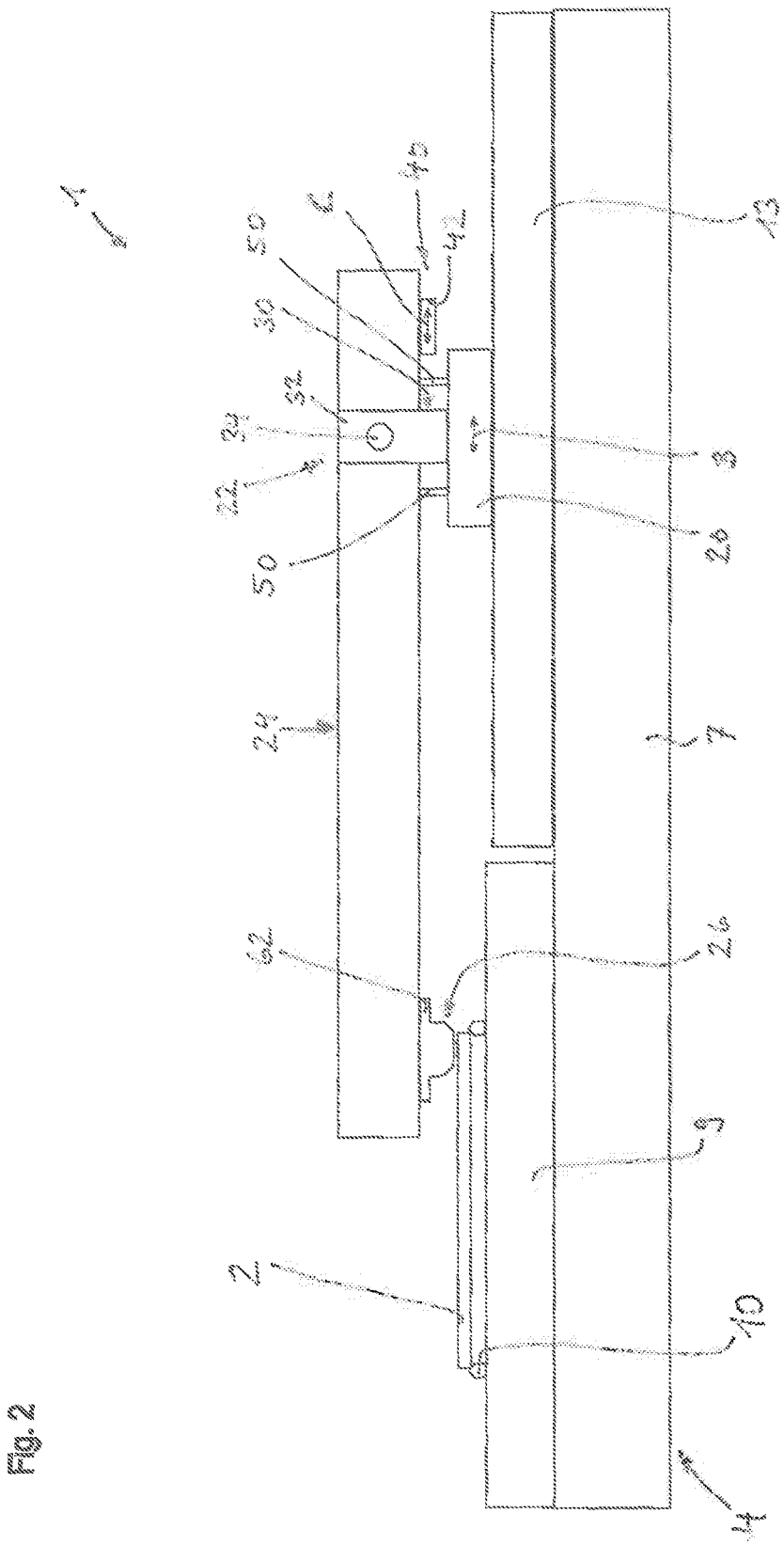

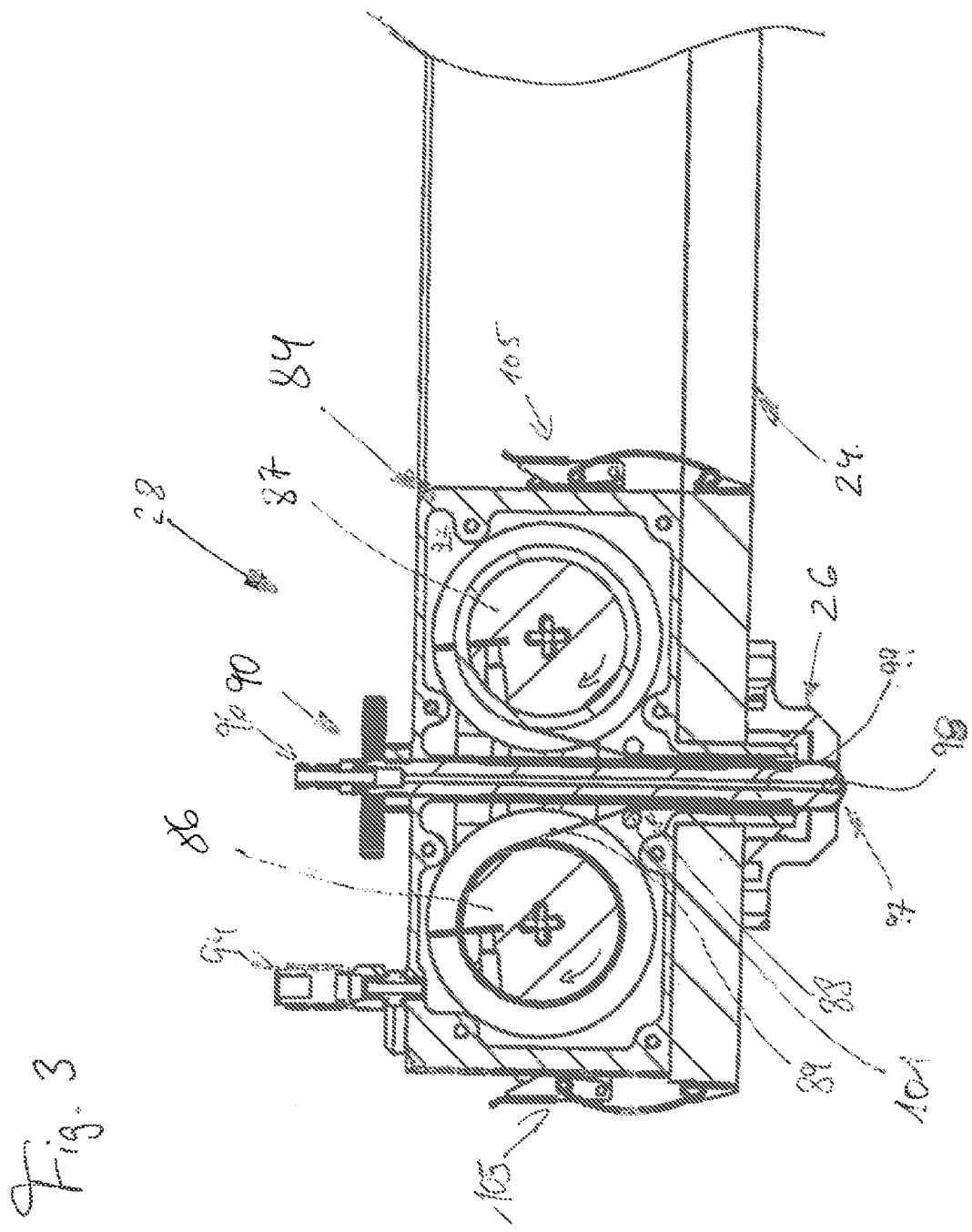

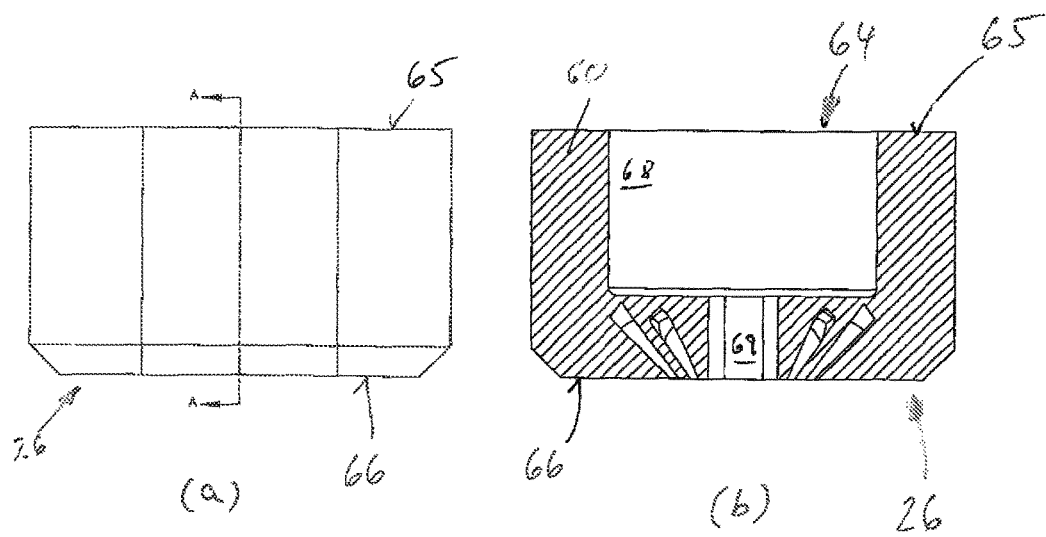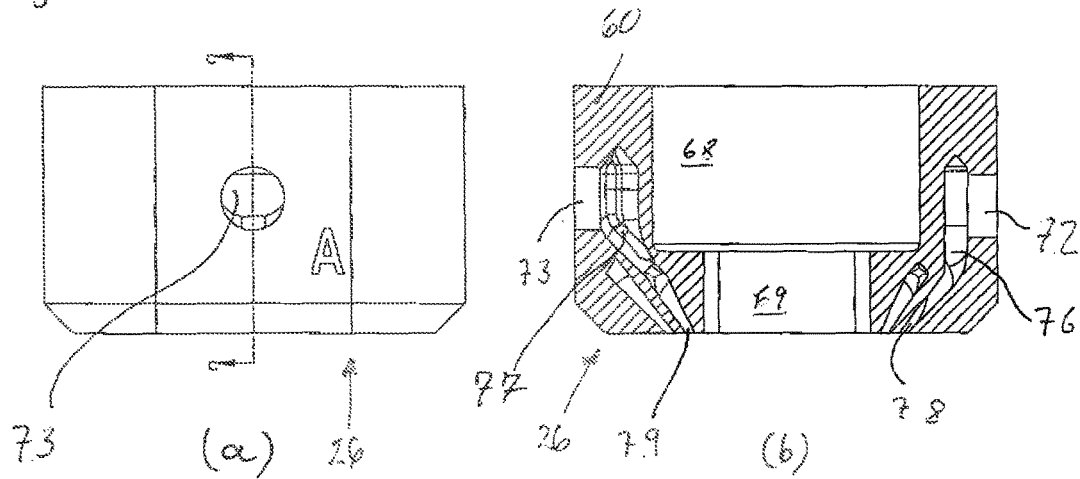

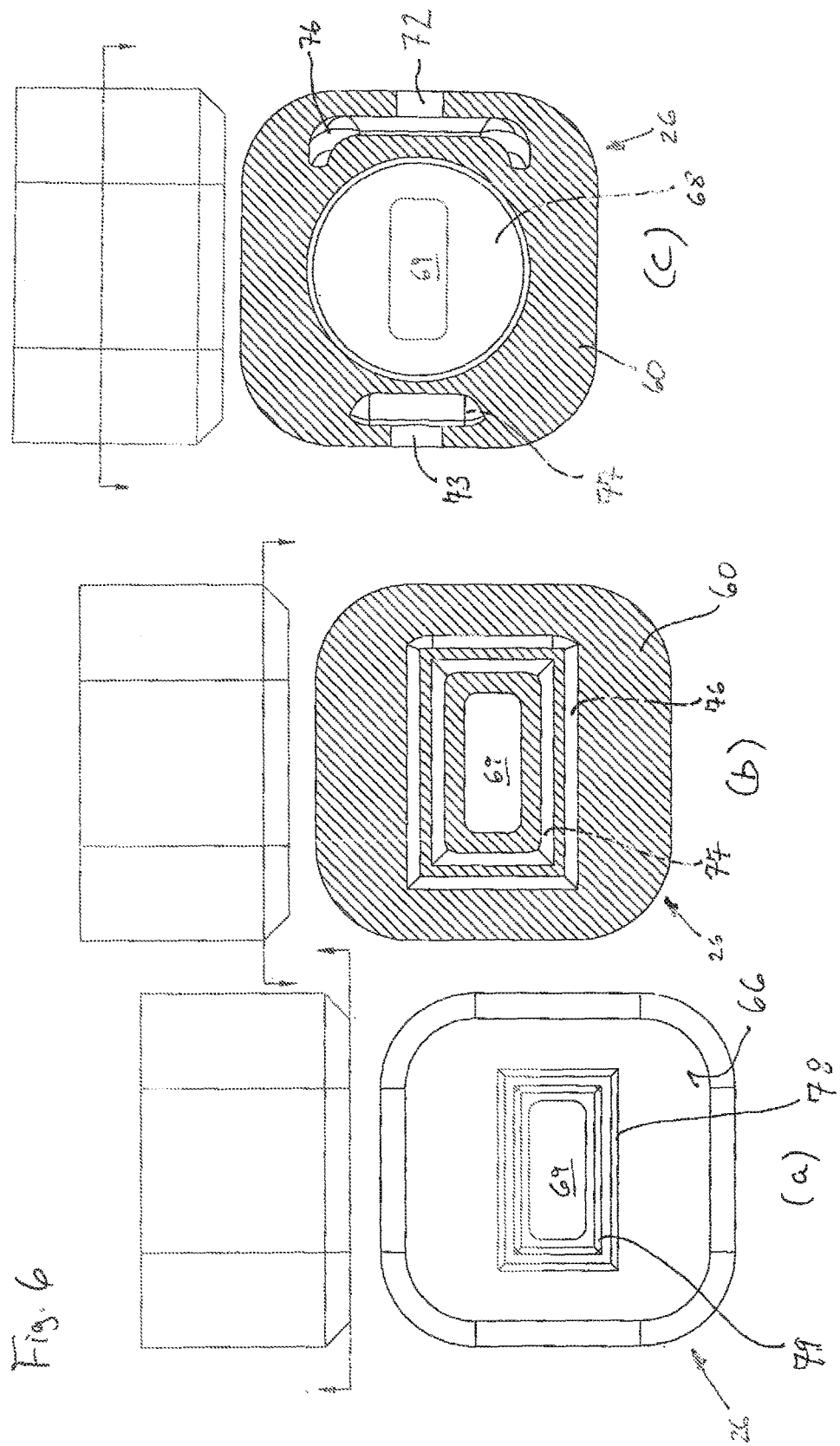

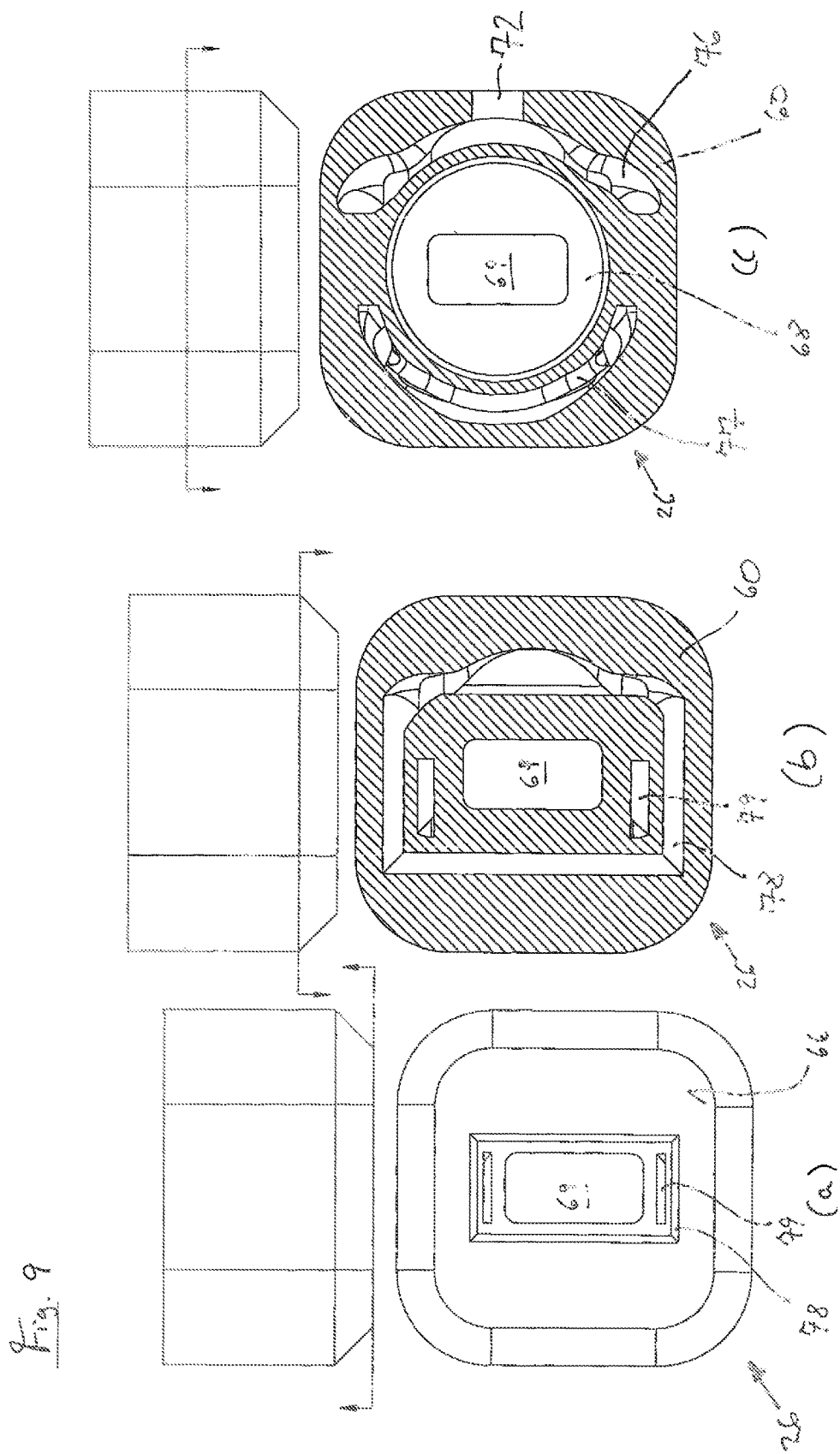

APPARATUS AND METHOD FOR CLEANING A PARTIAL AREA OF A SUBSTRATE

BACKGROUND OF THE INVENTION

The present invention relates to an apparatus and a method for cleaning a partial area of a substrate, in particular a photomask.

In many technical fields, and in particular in the semiconductor production field, cleaning of substrates may be challenging due to the required cleanliness of the cleaned substrates. One example of such a substrate, which requires high cleanliness, is a photomask, which is for example used in photolithography for the mass production of integrated circuit devices.

Any particles on the surfaces of such photomasks, in particular the patterned surfaces thereof may lead to errors in the substrates being imaged using the photomask. Therefore, regular cleaning of the photomasks is required, which, however may reduce the lifetime thereof. In order to protect certain surfaces of the photomasks from particle contamination, pellicles have been introduced. Pellicles are thin films or membranes, which are for example attached to a frame that is glued to one side of the photomask, such that the membrane acts as a cover preventing particles from reaching the covered surface. The pellicle is spaced far enough from the mask, so that moderate to small sized particles that may be present on the pellicle will be too far out of focus to influence imaging of the photomask. By using such pellicles, the cleaning cycles for photomasks may be reduced, thereby increasing the lifetime of the photomask and at the same time imaging results were improved.

However, such pellicle membranes have to be exchanged after a certain number of imaging cycles by removal of the pellicle frame, which is glued to the mask surface. After removal of the pellicle frame, some of the glue remains on the photomask, which has to be fully removed before a further pellicle membrane with frame may be attached to the photomask.

In the past, aggressive chemical cleaning solutions had to be used to remove the glue residuals from the surface of the photomask. For example, SPM has been employed over the past years to remove the typically polymeric glue residuals. Despite its good cleaning performances, SPM has created other problems such as haze generation. Further methods have been proposed to overcome the haze issues by for example using different chemistry which avoids haze generation. However, these chemistries often only allowed partial removal of the glue in acceptable time limits and full removal was difficult if at all achieved. For both the SPM and other chemistries, it was also not possible to only clean local areas of the photomask as the chemistry was not contained. Hence the chemistry was also applied to areas which did not need cleaning, thereby increasing the amount of chemistry needed and creating a danger of damaging those areas. Also dry removal methods such as laser ablation have been suggested to remove pellicle glue residuals, but these methods were very specific to a single use and difficult to control.

SUMMARY OF THE INVENTION

It is an object of the invention to provide an apparatus and a method for cleaning a partial area of a substrate, in particular a photomask, which may overcome one or more of the problems set forth above.

In accordance with the invention an apparatus as set forth in claim 1 and a method as set forth in claim 17 are provided. Further embodiments are inter alia disclosed in the respective dependent claims and the specification.

In particular, an apparatus for cleaning a partial area of a substrate, in particular a photomask, is provided. The apparatus has a cleaning head having a lower surface configured to be arranged above and in close proximity to the substrate area to be cleaned, the lower surface having a central opening formed therein, a first annular groove, surrounding the central opening, and at least a second groove, arranged between the first annular groove and the central opening. The first annular groove is fluidly connected to a first port allowing connection to an external supply source and the second annular groove is fluidly connected to a second port allowing connection to an external supply source. The apparatus also has a tape supply mechanism arranged to supply an abrasive tape to the central opening in the lower surface of the cleaning head, such that a portion of the abrasive tape protrudes therefrom, and a liquid media conduit having an outlet arranged to supply a liquid to a backside of the abrasive tape at or at the vicinity of the central opening. The apparatus may locally clean a surface portion of the substrate to be cleaned by means of a combination of a liquid, which may for example be chosen to soften or at least partially dissolve the material/particles to be cleaned of or to reduce the adhesion of the material/particle to the surface of the substrate, and a mechanical wiping action using the abrasive tape. Hereby, the term abrasive should mean that the tape material is sufficiently abrasive to remove particles from the surface but not to scratch the surface of the substrate itself. The protruding tape which provides the mechanical wiping action furthermore defines a defined gap between the substrate surface and the lower surface of the cleaning head, which allows defined flow conditions for any fluids, which may be applied/removed via the first and second grooves. The lower surface may be substantially planar or may for example also be slightly curved or slanted, wherein the distance between the respective first and second grooves and the lowest portion of the lower surface should not be too large to disruption of desired flow conditions.

The at least one second groove may comprise two grooves, which are arranged on opposite sides of the central opening. The second groove may also be an annular groove surrounding the central opening.

The apparatus may further comprising a liquid media source and a vacuum source, the liquid media source being connected to the second pert and the vacuum source being connected to the first port. Alternatively, the liquid media source could be connected to the first port and the vacuum source could be connected to the second port. Both arrangements enable a further liquid, such as a rinsing liquid, to be applied to the surface of the substrate to rinse off any particles removed by the central application of the liquid and the wiping action. Both liquids and any particles contained therein may then be sucked off the substrate surface to dean and dry the respective surface area. The arrangement allows the used liquids to be in substance contained within the area encompassed by the first groove, as long as a sufficient suction force is applied. This is true even when a liquid is applied to the first groove.

The cleaning head may comprise a unitary body of material having internal passages formed therein for connecting the first and second grooves with the first and second ports, respectively, thereby lowering the number of parts thereof that may cause failure and introduce contaminants.

The cleaning head may comprising a first group of flow openings opening towards the first groove and a second group of flow openings opening towards the second groove, wherein the flow openings of the first group are each connected to a common passage connecting flow openings of the first group with the first port and the flow openings of the second group are each connected to a common passage connecting flow openings of the second group with the second port. Such flow openings may be arranged in a side wall of the respective groove. Alternatively, at least one of the first and second grooves may in substance seamlessly merge into respective passages connecting the respective grooves to the respective ports.

In order to facilitate homogeneous fluid flow at at least one of the grooves, the flow cross section of its respective passage decreases from the respective port to the respective groove.

For positioning of the cleaning head and for cleaning larger areas, the apparatus comprises an arm and a moving mechanism, the arm being pivotally mounted to the moving mechanism at a first end portion thereof and the cleaning head being mounted to a second end portion of the arm, the moving mechanism being configured to move the arm and thus the cleaning head along a predetermined path. The pivotal mounting of the arm allows the cleaning head to be placed onto the substrate surface to be cleaned with a well defined force, as the arm may be balanced with respect to the pivot point similar to a classic tone arm of a turntable. The pivotal arm also allows the cleaning head to follow contours of the substrate surface when moving the cleaning head over the substrate areas to be cleaned, while applying a substantially constant force.

According to one aspect, the moving mechanism is a linear moving mechanism and is configured to move the arm along a path which is in substance parallel to the extension of the arm. This arrangement is particularly suited for glue lines such as generated when removing pellicle frames from photomasks but also for other elongates areas to be cleaned. In the case where two second grooves are provided, these may preferably be spaced along the direction of movement. A further moving mechanism for moving the arm in other directions to allow placing the cleaning head on any surface portion of the substrate may also be provided. Also, a combined moving mechanism for performing different movements may be provided.

The tape supply mechanism is in one aspect arranged to supply the tape in a direction to the central opening in the lower surface of the cleaning head, which is aligned with a direction of movement of the moving mechanism. Such alignment may prevent uncontrolled sideway swiping action, which could dislodge the tape from any guides elements provided to supply the same to the central opening. The tape supply mechanism and the moving mechanism may be controlled in a manner such that a supply speed of the tape is synchronized to a movement of the moving mechanism. In this context, synchronized is not limited to the same speed, but there is a certain correspondence between the respective speeds such that if one of the speeds increases the other also increases and if one decreases the other also decreases. This may ensure a good wiping action and that sufficiently fresh tape is made available at the point of contact with the substrate surface at all times.

In one aspect, the tape supply mechanism comprises a tape supply reel, a tape take up reel and at least one guide element for guiding the tape from the tape supply reel to the central opening in the lower surface of the cleaning head, to protrude therefrom over a predetermined distance and to the tape take up reel, the tape supply reel and the tape take up reel being arranged on opposite sides of the central opening in the lower surface of the cleaning head.

The apparatus may also have a balancing apparatus configured to provide a constant pressing force of the tape on the surface of a substrate to be cleaned, by shifting a weight along the arm, wherein the shifting of the weight may be based on at least one of the following: the amount of tape being moved from the tape supply reel to the tape take up reel and a sensor detecting the pressing force of the tape on the surface of the substrate. The movement of the tape from one wheel to the other changes the balance of the arm as the tape and thus weight is moved from a distal position to a more proximal position of the arm (decreasing the force with which the tape is pressed onto the substrate) or vice versa. To counterbalance this effect a weight may be shifted along the arm based on the movement of the tape. Alternatively, a force sensor may be used to measure the force applied via the tape to the substrate and the weight may be shifted in accordance with such a measurement. The weight may also be used to set an initial pressing force for the tape, which may be selected specific for the cleaning application. Also other means may be provided to achieve such a counterbalancing effect. According to one embodiment, the force of the abrasive tape acting on the substrate may be controlled to be between 0.1 N and 5N, and preferably by about 1N.

In accordance with a further aspect of the invention, a method for cleaning a partial area of a substrate, in particular a photomask is provided. The method comprises providing a cleaning head having a lower surface, the lower surface having a central opening formed therein, a first annular groove, surrounding the central opening, and at least a second groove, arranged between the first annular groove and the central opening; providing a tape supply mechanism arranged to supply an abrasive tape to the central opening in the lower surface of the cleaning head, such that a portion of the abrasive tape protrudes therefrom; placing the protruding portion of the abrasive tape in contact with the area of the substrate to be cleaned to thereby bring the lower surface of the cleaning head in close proximity to the substrate area to be cleaned; supplying a liquid to a backside of the abrasive tape at or at the vicinity of the central opening, such that at least the portion of the abrasive tape protruding from the central opening is wetted; causing a relative movement between the abrasive tape and the surface area of the substrate to be cleaned; applying a cleaning fluid to the substrata area to be cleaned via the at least one first groove or the at least one second groove; and applying a suction force to the other groove, i.e. the at least one second groove or the at least one first groove. This method allows localized cleaning of a surface area of the substrate to be cleaned, using simultaneously a mechanical wiping effect and a wet cleaning effect, while containing any liquids being used.

The amount of protrusion of the tape defines the gap between the substrate surface and the lower surface of the cleaning head and thus provides good control about the gap and the flow conditions of fluids within the gap.

The cleaning fluid may be a liquid media, which is applied via the second port, while the suction force is applied to the first port. Alternatively, the liquid media could be applied via the first port, while the suction force is applied to the second port. In accordance with one aspect, the application of liquids via the backside of the tape or via the respective groove is stopped well before the suction force stopped. In one aspect it is furthermore possible to apply a suction force to any passages through which a liquid has been supplied during the cleaning and before the cleaning head is moved of the substrata to be cleaned.

Causing a relative movement between the abrasive tape and the surface area of the substrate to be cleaned may include at least one of the following: moving the tape between a tape supply reel and a tape take up reel and moving the cleaning head along a predetermined path. While movement of only the tape allows a spot cleaning of the surface, movement of the cleaning head as a whole allows cleaning of larger areas. Preferably, the cleaning head may be moved along a linear path, which is aligned with the direction of extension of the protruding portion of the tape. Thereby forces acting on the tape transverse to its extension may be reduced. In accordance with a further aspect, both the tape and the cleaning head may be moved, wherein a tape supply mechanism for moving the tape and a moving mechanism for moving the cleaning head may be controlled in a manner such that a movement speed of the tape is synchronized with a movement speed of the cleaning head. Again the term synchronized as used here and throughout the application is not limited to the same speed but to a speed correspondence as explained herein above.

The method may comprise controlling the pressing force of the tape on the surface of a substrate to be cleaned, by shifting a weight along a pivotable arm, which supports the cleaning head and the tape supply mechanism on its free end, based on at least one of the following: an amount of tape being moved from a tape supply reel to a tape take up reel and a sensor detecting the pressing force of the tape on the surface of the substrate. According to one embodiment, the force of the abrasive tape acting on the substrate may be controlled to be between 0.1 N and 5N, and preferably by about 1N.

The method may preferably be used for removing glue, in particular a glue line, from a photomask. The method may also be used for other applications and in particular for the spot cleaning of certain areas. The method is particularly suited for using the apparatus described herein above.

BRIEF DESCRIPTION OF THE DRAWINGS

The invention will be described in more detail herein below with respect to the drawings. In the drawings:

FIG. 1 shows a schematic top view of a cleaning apparatus for cleaning a partial area of a substrate;

FIG. 2 shows a schematic side view of the cleaning apparatus of FIG. 1;

FIG. 3 shows a sectional view along a carrier arm and a tape supply mechanism, which may be used in the cleaning apparatus of FIG. 1;

FIG. 4 shows a side view (a) and a sectional view (b) of a cleaning head according to a first embodiment, which may be used in the cleaning apparatus of FIG. 1;

FIG. 5 shows another side view (a) and sectional view (b) of the cleaning head of FIG. 4;

FIG. 6 shows a series (a)-(c) of side views and sectional views of the cleaning head of FIG. 4;

FIG. 9 shows a series (a)-(c) of side views and sectional views of the cleaning head of FIG. 7.

DESCRIPTION OF PREFERRED EMBODIMENTS

Figure 7:
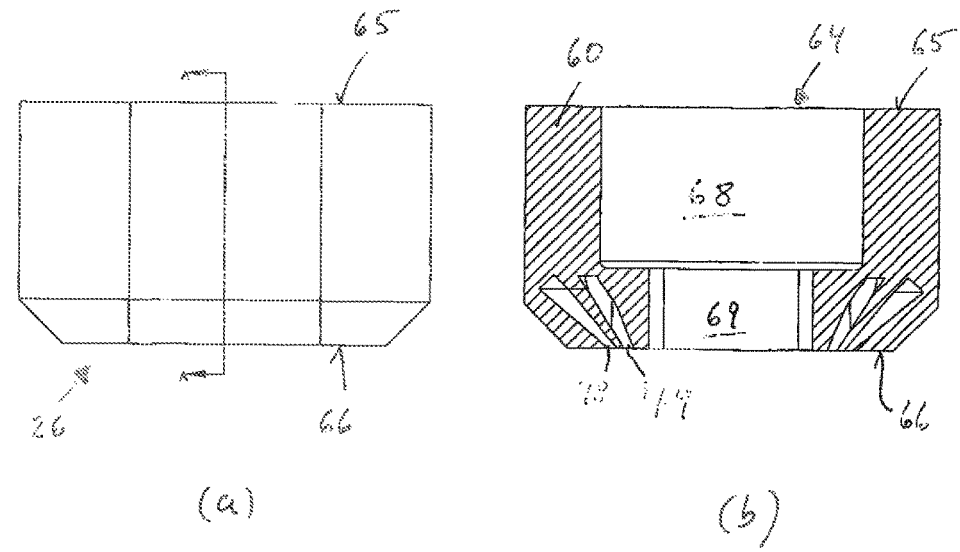
FIG. 7 shows a side view (a) and a sectional view (b) of a cleaning head according to a second embodiment, which may be used in the cleaning apparatus of FIG. 1.

For purposes of illustration, embodiments of the invention will be described as applied to the cleaning of a photomask, and in particular to the cleaning of pellicle glue lines from the photomask, although it will become apparent that they could also be applied to the cleaning of different substrates and for cleaning off of different materials and particles.

Directional phrases used herein, such as for example left, right, top, bottom, up, down, vertical horizontal and derivatives thereof, relate to the orientation of the elements shown in the drawings and are not limiting upon the claims unless expressly recited therein.

FIG. 1 shows a schematic top view of a cleaning apparatus 1 for cleaning a partial area of a substrate 2, and FIG. 2 shows a schematic side view of the cleaning apparatus 1. The cleaning apparatus 1 has a support structure 4 for supporting the substrate 2 and for supporting a cleaning device 5.

The support structure 4 has a base 7 of for example an elongated rectangular shape as seen in the top view of FIG. 1. The support structure 4 also has a support table 9, which is supported on the base 7. The support table 9 may have a circular shape, as seen in the top view of FIG. 1 and may be rotatably supported on the base 7 in any suitable manner such that the support table 9 may be rotated to different angular positions. The support table 9 has four support pins 10 for receiving a substrate 2, such as a photomask thereon. The support pins 10 are arranged to contact the substrate 2 at its corners and may have angled surfaces which provide a centering of the substrate 2 with respect to the support pins 10 and furthermore allow contacting of the Substrate 2, such as a photomask at its lower edges only. The substrate 2 may be placed on the support pins 10 such that the surface to be cleaned faces upwards and is in substance horizontally aligned. The skilled person will realize that other support structures for receiving and holding a substrate 4 in a cleaning position may be provided.

The cleaning device 5 has a first movable platform 13, a second movable platform 20, a support 22, a carrier arm 24, a cleaning head 26 and a tape supply mechanism 28, which is not shown in FIGS. 1 and 2, but is shown in FIG. 3. The first platform 13 is movably mounted on the base 7 adjacent the support table 9 supporting the substrate 2. The first platform 13 is movable along a linear direction transverse to the longitudinal extension of the base 7, as indicated by the double headed arrow A in FIG. 1. Guides for guiding the linear movement may be provided at least on one of the base 7 and the first platform 13. A suitable drive mechanism (not shown) for moving the first platform 13 is provided, the drive mechanism being connected to a controller for controlling the same.

The second platform 20 is movably mounted on the first platform 13. In particular, the second platform 20 is mounted such that it may move in a linear direction along the first platform 13. The direction of movement of the second platform 20 is in particular transverse to the linear direction of movement of the first platform 13, as indicated by the double headed arrow B in FIGS. 1 and 2. At least one of the first platform 13 and the second platform 20 may have a guide structure to guide the linear movement of the second platform 20 along the first platform 13. A suitable drive mechanism (not shown) for moving the second platform 20 is provided, the drive mechanism being connected to a controller (not shown) for controlling the same.

The support 22 is mounted onto the second platform 20 to be movable therewith. The support 22 as shown comprises a U-shaped bracket 30 having a base (not shown) mounted to the second platform 20 and two arms 32 extending away from the base and the second platform 20. The arms 32 extend in substance parallel to each other. The arms 32 are spaced to receive the carrier arm 24 therebetween. The support 22 further has a swivel pin 34, which extends between the arms 32 and through the carrier arm 24 received therebetween, to thereby pivotally mount the carrier arm 24 to the bracket 30. It should be noted that the described structure for pivotally mounting the carrier arm 24 to the second platform 20 is only a simplified example and that many other structures may be provided to pivotally mount the carrier arm 24 to the second platform 20.

The carrier arm 24 has a substantially straight elongated shape, having the cleaning head 26 and the tape supply mechanism 28 mounted on the end portion of a first section, which extends to the left with respect to the swivel pin 34. On an opposite second section of the carrier arm, which second section extends to the right with respect to the swivel pin 34, a counterbalance device 40 is provided. The first section is substantially longer than the second section. In particular, the first section may preferably be of a length such that a movement of the end portion measured at a central position of the cleaning head 26 over a vertical distance of 1 mm causes an angular movement of the carrier arm 24 around the swivel pin 34 of less than 0.5°, preferably of less than 0.2° The counterbalance device 40 balances the carrier arm 24 with respect to the swivel pin 34, such that the first and second sections of the carrier arm 24 are substantially but not fully balanced with respect to the swivel pin 34. In particular, the balance is adjusted such that the left section of the carrier arm 24 carrying the cleaning head 26 and the tape supply mechanism 28 tends to move downward and may exert a predetermined force onto a substrate 2 when moving into contact therewith.

The counterbalancing device 40 may be adjustable. In the embodiment shown, the counterbalancing device 40 for example has a movable weight 42, which may be moved by a suitable drive mechanism (not shown) along the carrier arm 24, as indicated by the double headed arrow C. As the skilled person will realize, moving the weight 42 will change the balance of the carrier arm 24 with respect to the swivel pin 34. The counterbalancing device 40 may be of a type which allows the balance of the carrier arm 24 to be adjusted during a cleaning operation, by having the drive mechanism for the weight 42 connected to a controller, which may receive data with respect to the cleaning process. Such data, which may influence the balance of the carrier arm 24, are for example a tape movement within the tape supply mechanism 28. The controller may also receive a force signal of an appropriate sensor measuring the force with which a tape of the tape supply mechanism 28 presses onto a substrate to be cleaned. The force exerted by the tape supply mechanism 28 when it presses onto a substrate may be controlled to be between 0.1 N and 5N, and is preferably controlled to be about 1N. As indicated above, the force may be controlled to be in substance constant throughout a cleaning process.

The movable weight is only one example for balancing the carrier arm in a predetermined manner with respect to the swivel pin 34. The skilled person will realize that the counterbalancing device 40 may also have other elements in addition to or in lieu of a movable weight, such as springs. Such springs may for example be attached between the second (right) section of the carrier arm and the second platform 20, pulling the second (right) section of the carrier arm 24 downwards with a predetermined force, counter to the tendency of the (longer) second section of the carrier arm to move downwards. Such springs may also be mounted such that the pulling force may be adjustable to provide a counterbalancing device 40 which may adjust the balance as required. Furthermore, the counterbalancing device 40 may be controlled to adjust the balance such that the cleaning head tends to be lifted up, to thereby provide a lifting function.

Although the movable weight 42 of the counterbalancing device 40 is shown to be mounted on the second section of the carrier arm 24, it could also be provided on the first section, if for example a sufficiently heavy and static weight is provided on the second section.

To limit and moderate the pivotal movement of the carrier arm 24, one or more dampers 50 may be provided on the second platform 20. In particular, first and second dampers 50 may be provided on opposite sides of the support bracket 32, i.e. on opposite sides with respect to the swivel pin 34 in the longitudinal direction of the carrier arm 24. The dampers 50 may for example be formed by springs extending between the platform 20 and the lower surface of the carrier arm 24. In such a configuration, when the carrier arm 24 pivots, one of the springs will be compressed, while the other may be extended. The dampers 50 may be of the same type and may be arranged symmetrically with respect to the swivel pin to not or not substantially change the balance of the carrier arm 24. The dampers 50 may be configured to set a maximum pivotal movement of the carrier arm.

Although the dampers 50 are shown to be mounted on the second platform 20, the dampers 50 or one of the dampers 50 may also be mounted on the carrier arm to extend downward towards the first or second platform 13, 20.

The dampers 50 may normally limit a vertical up and down movement of the end portion of the first section of the carrier arm 24 as measured at a central position of the cleaning head 26 to be within 2 cm with respect to a central position, in which the carrier arm 24 extends horizontally. The dampers 50 may be resiliency mounted to allow further movement upon the application of a force, which exceeds a certain threshold, to prohibit damage to the carrier arm 24 or the elements attached thereto, in exceptional situations.

Figure 8:
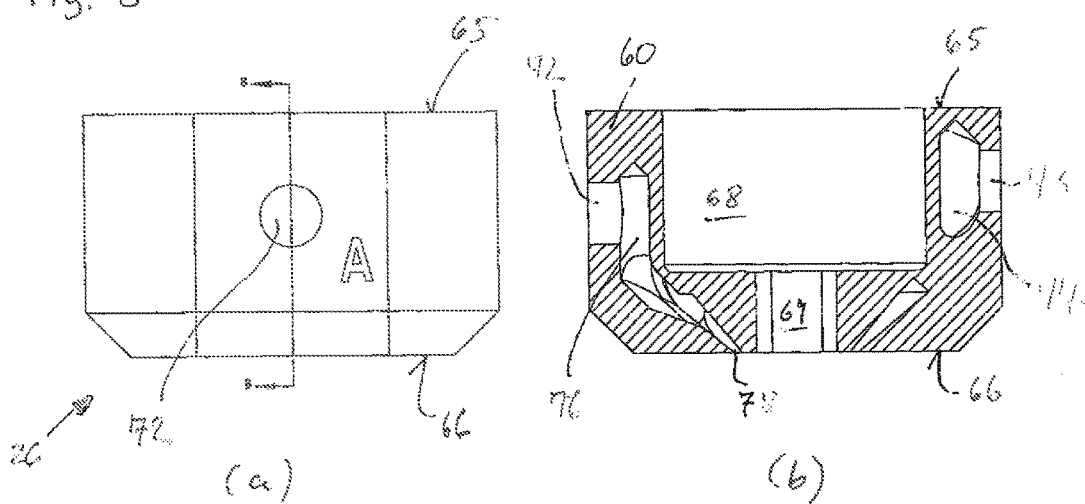
FIG. 8 shows another side view (a) and sectional view (b) of the cleaning head of FIG. 7.

The cleaning head 26, which is one of the key elements of the cleaning device 5 will be explained in more detail with respect to FIGS. 4 to 9. FIGS. 4 to 6 show a cleaning head 26 according to a first embodiment and FIGS. 7 to 9 showing a cleaning head 26 in accordance with a second embodiment. Throughout the different embodiments, the same reference signs will be used when referring to similar or the same elements.

FIG. 4a shows a first side view of the cleaning head 26 corresponding to the side view in FIG. 2, and FIG. 5A shows a side view of the cleaning head 26 as seen from the left in FIG. 2. FIG. 4B shows a vertical sectional view along the line A-A in FIG. 4A and FIG. 5B shows a vertical sectional view along the line C-C in FIG. 5A. In FIG. 6A to C, the top half of each figure shows a side view of the cleaning head 26 similar to FIG. 4A and the lower portion of the figure shows a respective bottom or cross-sectional view as seen along the respective lines shown in the upper part of the figures.

The cleaning head 26 is made of a unitary body of material 60, which is for example formed by but not limited to 3D-printing or molding, in particular Injection molding. The unitary body of material 60 may be formed of any suitable material, such as stainless steel of any other suitable material which is sufficiently rigid and compatible with the media being used. As seen from the top or bottom, the cleaning head 26 has a substantially square shape having rounded edges. From the side, the cleaning head 26 has a substantially rectangular shape with a taper at the lower end thereof. Although not shown in FIGS. 4 to 6, the cleaning head 26 may have mounting flanges for mounting the same to the carrier arm 24 as indicated at 62 in FIG. 2.

The cleaning head 26 has a central opening 64 extending from a top surface 65 to a lower surface 66 of the cleaning head 26. The lower surface 66 is a substantially planar surface, but may also be slightly curved or tapered towards the central opening. The opening 64 is stepped in the vertical direction having an upper portion 68 adjacent the upper surface 65, which has a larger cross section than a lower portion 69 adjacent the lower surface 66. In particular, the upper portion 68 of the opening 64 may have a round cross section and the lower portion 69 may have an elongated rectangular cross section having rounded edges, as can be best seen in FIG. 6c. The lower portion 69 is centered with respect to the upper portion 68 of the opening 64.

First and second fluid ports 72 and 73 are provided in opposite sides of the cleaning head 26. The fluid ports 72, 73 extend into the unitary body of material 60 and are fluidly connected via first and second internal passages 76, 77 to respective first and second grooves 78, 79 formed in the lower surface 66 of the cleaning head 26. The fluid ports 72, 73 are formed in sides of the cleaning head 26, which are in substance parallel to the short sides of the lower portion 69 of the central opening 64, as for example shown in FIG. 6c. The fluid ports 72, 73 are formed in the cleaning head 26 at an elevation, which corresponds in elevation to the position of the upper portion 68 of the central opening 64. The ports 72, 73 are formed at the same heights, may also be formed at different heights.

The ports 72, 73 each have a circular cross section and may have structures, such as but not limited to a female screw or a bayonet structure or other any other suitable structure to enable the attachment of external conduits (not shown), which may connect the respective ports to suitable fluid sources as will be described with more detail herein below. The ports 72, 73 may also be formed to protrude from the respective sides of the cleaning head 26 (rather than extending onto the same) and may have female or male attachment structures to enable attachment of external conduits.

As previously mentioned, the first and second ports 72, 73 are fluidly connected to first and second internal passages 76 and 77, respectively, which connect the first and second ports 72, 73 to respective first and second grooves 78, 79 formed in the lower surface 66 of the cleaning head. In particular, the first port 72 is connected via the first Internal passage 76 to first groove 78, which is formed in the lower surface 66 and which fully surrounds the lower portion 69 of the central opening 64. As can be seen in the bottom view of FIG. 6A the first groove 76 has a rectangular, annular shape, fully surrounding the lower portion 69 of the central opening 64. Similarly, second port 73 is connected via the second internal passage 77 to the second groove 79 formed in the lower surface 66 of the cleaning head. The second groove 79 is again a rectangular annular groove, fully surrounding the lower portion 69 of the central opening 64 as can be seen in FIG. 6A. The second groove 79 is arranged between the first groove 78 and the lower portion 69 of the central opening 64, as can be seen in FIG. 6A.

The internal passages 76, 77 each have an angled lower portion adjacent the respective groove 78, 79 such that the passage is angled inwards towards the lower portion 69 of the central opening 64, as best seen in FIGS. 4B and 5B. The passages 76, 77 each have a flow cross section, which decreases from the respective port 72, 73 to the respective grooves 78, 79. As seen in FIGS. 6C and 6B, the internal passages 76, 77 the shape of the passages changes from a chamber like cross section adjacent the ports to an annular cross sectional shape corresponding to the shape of the grooves 78, 79, as the passages approach the lower surface 66 of the cleaning head. This change is shape may be a smooth change avoiding sharp angles and thus provides a smooth and homogeneous fluid flow through the respective passages.

A second, alternative embodiment of the cleaning head will now be described with reference to FIGS. 7 to 9. Again the same reference signs will be used for the same or similar elements.

FIG. 7a shows a first side view of the cleaning head 26 similar to FIG. 4 and FIG. 8a shows a side view of the cleaning head 26 similar to FIG. 5a. FIGS. 7b and 8b again show sectional views along line A-A in FIG. 7a and along line C-C in FIG. 8a, similar to FIGS. 4b and 5b. In FIG. 9a to c, the top half of each figure shows a side view of the cleaning head 26 similar to FIG. 7a and the lower portion of the figure shows a respective bottom or cross-sectional view as seen along the respective lines shown in the upper part of the figures.

The cleaning head 26 has in substance the same outer shape as the cleaning head of the first embodiment. Also the position and shape of central opening 64 extending from a top surface 65 to a lower surface 66 of the cleaning head 26 is the same.

Also, first and second fluid ports 72 and 73 are provided in opposite sides of the cleaning head 26. The fluid ports 72, 73 extend into the unitary body of material 60 and are fluidly connected via first and second internal passages 76, 77 to respective first and second grooves 78, 79 formed in the lower surface 66 of the cleaning head 26. In this embodiment, the fluid ports 72, 73 are formed in the sides of the cleaning head 26, which are in substance parallel to the long sides of the lower portion 69 of the central opening 64, as for example shown in FIGS. 8 b and 9c. The fluid ports 72, 73 are formed in the cleaning head 26 at different elevations, the location of both of which correspond in elevation to the position of the upper portion 68 of the central opening 64. The first port 72 is formed closer to the top surface 65 than the second port 73, but they could also be formed at the same height.

The ports 72, 73 may have the same shape as previously described with reference to the first embodiment.

As previously mentioned, the first and second ports 72, 73 are fluidly connected to first and second Internal passages 76 and 77, respectively, which connect the first and second ports 72, 73 to respective first and second grooves 78, 79 formed in the lower surface 66 of the cleaning head. In particular, the first port 72 is connected via the first internal passage 76 to first groove 78, which is formed in the lower surface 66 and which again fully surrounds the lower portion 69 of the central opening 64. As can be seen in the bottom view of FIG. 9A the first groove 78 has a rectangular, annular shape, fully surrounding the lower portion 69 of the central opening 64. The second port 73 is connected via the second internal passage 77 to two spaced second grooves 79 formed in the lower surface 66 of the cleaning head. The two second grooves 79 are linear groves, arranged on opposite sides of the lower portion 69 of the central opening 64 adjacent the short sides thereof, as can be seen in FIG. 9a.

The second grooves 79 are arranged between the first groove 78 and the lower portion 69 of the central opening 64, as can be seen in FIG. 9*a*.

The internal passages 76, 77 each have an angled lower portion adjacent the respective groove(s) 78, 79 such that the passage is angled inwards towards the lower portion 69 of the central opening 64, as best seen in FIGS. 4B and 5B. The internal passages 76, 77 each have a flow cross section, which decreases from the respective port 72, 73 to the respective grooves 78, 79. As seen in FIGS. 9*b* and 9*c*, the shape of the Internal passages 76, 77 changes from a first cross section adjacent the ports to an annular cross sectional shape and two separated linear cross sections, respectively, corresponding to the shape of the grooves 78, 79, as the internal passages 76, 77 approach the lower surface 66 of the cleaning head 26. This change is shape may be a smooth change avoiding sharp angles and thus provides a smooth and homogeneous fluid flow through the respective internal passages 76, 77.

The first and second embodiments thus differ mainly with respect to the location of the ports 72, 73 with respect to the lower portion 69 of the central opening 64, the shape and location of the first and second grooves 78, 79 in the lower surface 66 of the cleaning head and hence with respect to the shape and location of the respective internal passages 76, 77.

Irrespective of the embodiment of the cleaning head 26, in operation, one of the ports is to be connected to a supply source for supplying a rinsing or cleaning fluid, in particular a rinsing or cleaning liquid, such as a glycol based liquid or any other suitable cleaning or rinsing liquid, such as a water based liquid. The other of the ports is to be connected to a suction source, such as a vacuum pump.

Irrespective of the embodiment, the cleaning head 26 may be mounted to a lower side of the carrier arm 24, such that the central opening 64 in the cleaning head 28 is aligned with a corresponding opening in the carrier arm, which allows passage of a portion of the tape supply mechanism 28 through the carrier arm and the cleaning head, as shown in FIG. 3. Also, irrespective of the embodiment, the cleaning head 26 may be mounted to the carrier arm 24, such that the long sides of the lower portion 69 of the central opening 64 extend in substance parallel to an extension of the carrier arm 24.

The tape supply mechanism 28 will be describe next with respect to FIG. 3, which shows an enlarged cross sectional view through a front end of the carrier arm 24. As can be seen, the cleaning head 26 is attached to a lower surface of the carrier arm 24 and the tape supply mechanism 28 is mounted in a receiving space provided within the carrier arm 24.

The tape supply mechanism 28 is of a cartridge type, which may be mounted in and removed from the carrier arm 24 as one unit. The tape supply mechanism 28 has a cartridge housing 84, a tape supply reel 86, a tape take up reel 87, a guide structure 88 for guiding a tape 89 along a predetermined path from the tape supply reel 86 to the tape take up reel 87, and a conduit 90 for supplying a liquid to the tape 89. The cartridge housing 84 has an external shape complementary to a respective receiving space on the carrier arm 24 and may be made of any suitable material. The cartridge housing 84 forms an inner chamber 92 for receiving and rotatably support the tape supply reel 86 and the tape take up reel 87, and for receiving at least part of the guide structure 88 and at least a portion of conduit 90. The cartridge housing 84 has a central opening both in the top and bottom wall thereof, which allows the conduit 90 to pass therethrough. The bottom wall provides outwardly extending flanges around the opening in the bottom wall, which provide a sufficient clearance for the passage of the conduit 90 and twice the passage of the tape 89. The walls of the flanges facing to each other may be coated with a low friction material. A further opening may be provided in the top wall of the cartridge housing 84, through which an optional sensor 94 for sensing the amount of tape on the tape supply reel 86 may be mounted.

As indicated above, both the tape supply reel 86 and the tape take up reel 87 are rotatably supported within the chamber 92 of the cartridge housing 84. A drive mechanism (not shown) for driving rotation of the tape take up reel 87 and optionally also the tape supply reel 86 is provided. In particular, a servo drive and a DC motor are being taken into consideration, which may provide a constant tension within the tape and may provide as continuous movement or a semi-continuous movement of the tape 89. The speed of movement may be controlled by a respective controller (not shown), which may be the same as or a different one to the one controlling the movement of the second platform 20. The controller may control the speed of movement of the tape 89 based on the speed of the second platform or vice versa, such that there is a predetermined relation between the respective speeds and in particular a synchronization.

The conduit 90 is arranged to extend through the cartridge housing 84 through the respective openings in the top and bottom wall thereof. In so doing the conduit 90 at least partially separates the chamber 92 into left and right chamber halves, each holding one of the tape supply reel 86 and the tape take up reel 87. The conduit 90 has an upper attachment end 96 protruding form the top wall of the cartridge housing 84, which is shaped to allow attachment to an external conduit (not shown), which may be connected to an external liquid supply. In particular, the conduit may be connected to a solvent supply, providing a solvent such as an aliphatic or aromatic solvent, such as Toluene, Tetrahydrofurane (THF), Cyclohexanone, Dipentene or mixtures of the above, which would for example be well suited for dissolving pellicle glue. Depending on the cleaning operation other solvents may be suitable. As the skilled person will realize the type of solvent will be dependent on the specific application.

The conduit 90 has a lower guide end 97 having an outlet opening 98 and an Internal passage 99 connecting the upper attachment end 96 and the outlet opening 98 in lower guide end 96. The lower guide end 97 has a rounded shape in a direction from the tape supply reel 86 to the tape take up reel 87, as shown in FIG. 3, but has a substantially straight shape in the direction transverse thereto. The outlet opening 98 is centrally located at the fulcrum of the rounded shape, but may also be located offset hereto, in particular angled towards the side at which the tape supply reel 86 is located. The lower guide end 97 extends a predetermined distance from the bottom wall of the cartridge housing 84.

The tape 89, which is Initially mainly roiled onto the tape supply reel 86 is guided from the tape supply reel 86 to the tape take up reel 87, via the guide structure 88, to be moved from the tape supply reel 86 to the tape take up reel 87. The guide structure 88 is for example formed by respective structures in the cartridge housing 84 such as guide bars or rollers 101 and optionally the inner surfaces of the flanges on the bottom surface of the cartridge housing 84. The outer surface of the conduit 90 at least in pad also forms part of the guide structure. In particular, the tape 89 is guided to extend around the lower guide end 97 of the conduit 90, such that the tape extends out of the cartridge housing 84, around the protruding lower guide end and back into the cartridge housing 84 towards the tape take up reel 87.

The tape 89 is formed from a woven material, made of a Polyester-Nylon mixture or any other suitable material. Presently, a Polyester-Nylon mixture of about 75% Polyester and about 25% Nylon is found suitable. The tape, however, may also have a non-woven structure. The tape 89 is porous and allows the passage of a processing liquid in particular a suitable solvent therethrough, which may be applied to the backside thereof at the outlet opening 98 of conduit 90. The material and structure of the tape 89 is chosen to have abrasive properties, such that it may scrape off or loosen particles from the surface of the substrate to be cleaned. The material and structure of the tape 89 is chosen such that under normal conditions it may not scratch the material of the substrate surface.

The carrier arm 24 may have attachment brackets 105 for removably securing the tape supply mechanism 28 in a predetermined position on the arm, when received therein. Other attachment means for securing the tape supply mechanism 28 to the carrier arm 24 may be provided.

The tape supply mechanism 28 and in particular the cartridge housing 84 and the conduit 90 are shaped and dimensioned such when properly secured to the carrier arm 24, the lower guide end 97 of the conduit 90 and the tape 89, which is guided there around extend through the lower portion 69 of the central opening in the cleaning head. The tape 89 thereby protrudes below the lower surface 66 of the cleaning head by a predetermined distance. The distance defines a predetermined gap between the lower surface 66 of the cleaning head 26 and an upper surface of a substrate 2, when the tape 89 is positioned to rest on the upper surface of the substrate 2, as shown for example in FIG. 2. The cleaning system 5 is set up such that the carrier arm 24 extends in substance horizontally when the tape 89 is positioned to rest on the upper surface of the substrate 2, as for example shown in FIG. 2. As the skilled person will realize, the horizontal alignment of the carrier arm 24 in such a situation may be dependent on the thickness of the substrate, which may change the elevation of the upper surface of the substrate when received on the support pins. To accommodate for substrates of different thicknesses, am optional heights adjustment mechanism may be provided that is configured to set a predetermined elevational relationship between the central axis of the swivel pin 34 and the surface of the substrate to be cleaned. Such a heights adjustment mechanism may for example comprise at least one of but not limited to the following: heights adjustable support pins 10, a heights adjustable platform 9 and a heights adjustable support 22.

Operation of the apparatus 1 will be explained herein below with reference to the drawings and with reference to a specific cleaning operation including removal of a pellicle glue line from the surface of a photomask. The photomask 2, having pellicle glue lines thereon, which for example remain after removal of a frame for a pellicle, is placed onto the support pins 10 on platform 9. The photomask 2 is placed onto the support pins 10 such that the side carrying the pellicle glue lines face upwards. Typically, such pellicle glue lines extend parallel to the sides of the photomask 2. By rotation of the platform 9, a first pellicle glue line may be aligned such that it extends in substance parallel to the extension of carrier arm 24.

By moving movable platform 13, the carrier arm 24 may be aligned with the respective pellicle glue line. By moving platform 20 with respect to movable platform 13, the cleaning head 26 may now be placed over one of the ends of the respective pellicle glue line. The cleaning head 26 may then be lower such that the protruding portion of the tape 89 contacts the very end of the pellicle glue line or is placed in line but adjacent thereto. In this position, the carrier arm 24 is arranged substantially horizontal.

Via the conduit 90 a solvent which is suitable for softening and/or at least partially dissolving the material of the pellicle glue line is supplied to the back side of the tape 89, in order to soften or at least partially dissolve the same. The solvent may also cause swelling of the glue, enabling better removal by the tape 89. At the same time or even before the application of the solvent, a suction force may be applied to the first groove 78 and a liquid may be supplied to a second groove 79. In the following description, a suction force will be applied to the first, outer groove 78 and a cleaning or rinsing fluid is supplied to the second, inner groove 79. It is, however, also possible to apply a respective suction force to the inner groove 79 and to apply a cleaning or rinsing fluid to the first, outer groove 78. In either case, the suction force and the supply of liquid may be controlled such that the cleaning or rinsing liquid applied to the respective groove will contact the surface of the photomask and will be completely sucked into the other groove.

In the arrangement as described, the cleaning or rinsing liquid will flow from the second, inner groove towards the first, outer groove and will be sucked off the surface of the photomask.

The carrier arm is balanced such that the cleaning head 26 and in particular the protruding portion of the tape 89 pushes onto the surface of the photomask with a predetermined force, as previously discussed. In particular, the force of the tape acting on the substrate may be controlled to be between 0.1 N and 5 N, and preferably by about 1 N. The carrier arm 24 is then moved linearly via platform 20 along the pellicle glue line. At the same time, the tape supply mechanism is activated, to supply the tape 89 to the lower portion 69 of the central opening 64, such that the tape 89 is moved from the tape supply reel 86 towards the tape take-up reel 87. Movement of the carrier arm 24 and of the tape supply mechanism 28 may be controlled by a respective controller and respective movement speeds may be synchronized in a predetermined manner. The respective movements of the tape 89 and the carrier arm 24 may be continuous or semi-continuous (i.e. in small steps) in order to provide a short remaining time of the tape on each part of the pellicle glue line to be removed.

The solvent supplied to the back side of the tape 89 softens or at least partially dissolves the glue of the pellicle glue line and a rubbing or a wiping action caused by movement of the carrier head and/or the tape 89 lead to removal of the pellicle glue line at the point of contact with the tape 89. Due to the respective movement of the carrier arm 24, portions of the photomask surface, which had been previously in contact with the tape will now be placed under the groove 79 through which a cleaning or rinsing liquid, such as described above, is supplied. This cleaning or rinsing liquid mixes with the solvent and any dissolved glue material and glue particles rubbed off the surface of the photomask and this mixture will then be sucked off the substrate surface via the first groove 78. By moving the carrier arm 24 sufficiently far over the photomask the complete pellicle glue line may be removed.

When the end of the pellicle glue line is reached such that it is completely removed and any remains thereof have been sucked into the first groove 78, the supply of liquids may be stopped. The suction may be upheld at least for a predetermined time, in order to ensure that all liquids are sucked off the photomask surface. In order to ensure that no liquid drops still reach the substrate surface, the flows within the respective conduits leading to the second groove 79 and the conduit 90 may be reversed and a suction force may also be applied thereto.

The cleaning head 26 may then be lifted up and moved to another pellicle glue line, such as a parallel extending parallel glue line at the opposite end of the surface of the photomask 2. The above operation may then be repeated. After removing the second pellicle glue line, the photomask 2 may for example be rotated by 90° via platform 9 and the remaining pellicle glue lines may be removed by repeating the above process. Rather than lifting up the cleaning head 26 after removing a complete pellicle glue line, the movement of the carrier arm 24 may be continued, until the cleaning head 26 moves over the side of the photomask 2, for example onto a respective adjacent element, thereby avoiding a problem of any liquids dropping onto the photomask, when the cleaning head is lifted up.

The above process combines a solvent based wet cleaning with a mechanical wiping action in a particularly advantageous manner. In particular, by locally supplying the solvent such that it is surrounded by a rinsing media, the rinsing media may remove the solvent and any debris within one operational step. Furthermore, by having the rinsing media surrounding the solvent during operation, air may be kept out of the area where the solvent is applied, thereby providing a solvent rich environment. The flow of the solvent and the rinse media may be adjusted such that a small amount of solvent is used in comparison to the rinse media.

Although the above operation was described with respect to the removal of pellicle glue lines from photomasks, the cleaning apparatus 1 may also be used for cleaning other substrates and may in particular be used for spot cleaning of the substrate, i.e. cleaning a small localized area of the substrate. For example, the cleaning hat 26 may be positioned over a portion of the substrate to be cleaned, lowered thereon such that the tape 89 contacts the area to be cleaned. By providing the respective cleaning liquid and rinsing liquids and by activating the tape supply mechanism, without moving the carrier arm, the specific local area may be cleaned by both a chemical action and a wiping action. Due to the specific application of the suction force, all liquids may be sucked off the surface thus allowing cleaning and drying in one operation.

The invention has been described herein above with reference to specific embodiments without being limited to the specific embodiments. The skilled person will realize different modifications and uses for the inventive holder, apparatus and method without deviating from the scope of the invention as defined by the claims.

The invention claimed is:

1. An apparatus for cleaning a partial area of a substrate, in particular a photomask, the apparatus comprising:
 a cleaning head having a lower surface configured to be arranged above and in close proximity to the substrate area to be cleaned, the lower surface having a central opening formed therein, a first annular groove, surrounding the central opening, and at least a second groove, arranged between the first annular groove and the central opening, the first annular groove being fluidly connected to a first port allowing connection to an external supply source and the second annular groove being fluidly connected to a second port allowing connection to an external supply source;
 a tape supply mechanism arranged to supply an abrasive tape to the central opening in the lower surface of the cleaning head, such that a portion of the abrasive tape protrudes therefrom;
 a liquid media conduit having an outlet arranged to supply a liquid to a backside of the abrasive tape at or at the vicinity of the central opening.

2. The apparatus of claim 1, wherein the lower surface is substantially planar.

3. The apparatus of claim 1, wherein the at least one second groove comprises two grooves, which are arranged on opposite sides of the central opening.

4. The apparatus of claim 1, wherein the second groove is an annular groove surrounding the central opening.

5. The apparatus of claim 1, further comprising a liquid media source and a vacuum source, the liquid media source being connected to the second port and the vacuum source being connected to the first port.

6. The apparatus of claim 1, further comprising a liquid media source and a vacuum source, the liquid media source being connected to the first port and the vacuum source being connected to the second port.

7. The apparatus of claim 1, wherein the cleaning head comprises a unitary body of material having internal passages formed therein for connecting the first and second grooves with the first and second ports, respectively.

8. The apparatus of claim 1, further comprising a first group of flow openings opening towards the first groove and a second group of flow openings opening towards the second groove, the first and second group of flow openings are each connected to a common passage connecting the first group with the first port and the second group with the second port.

9. The apparatus of claim 1, wherein at least one of the grooves merges into a passage connecting the respective groove to the respective port.

10. The apparatus of claim 1, wherein the flow cross section of at least one of the passages connecting one of the grooves with the respective port decreases from the respective port towards the respective groove.

11. The apparatus of claim 1, the apparatus further comprising an arm and a moving mechanism, the arm being pivotally mounted to the moving mechanism at a first end portion thereof and the cleaning head being mounted to a second end portion of the arm, the moving mechanism being configured to move the arm and thus the cleaning head along a predetermined path.

12. The apparatus of claim 11, wherein the moving mechanism is a linear moving mechanism and is configured to move the arm along a path which is in substance parallel to the extension of the arm.

13. The apparatus of claim 11, wherein the tape supply mechanism is arranged to supply the tape in a direction to the central opening in the lower surface of the cleaning head, which is aligned with a direction of movement of the moving mechanism.

14. The apparatus of claim 11, further comprising a controller configured to control the tape supply mechanism and the moving mechanism such that a supply speed of the tape is synchronized with a movement of the moving mechanism.

15. The apparatus of claim 11, wherein the tape supply mechanism comprises a tape supply reel, a tape take up reel and least one guide element for guiding the tape from the tape supply reel to the central opening in the lower surface of the cleaning head, to protrude therefrom over a predetermined distance and to the tape take up reel, the tape supply reel and the tape take up reel being arranged on opposite sides of the central opening in the lower surface of the cleaning head.

16. The apparatus of claim 15, comprising a balancing apparatus configured to provide a constant pressing force of the tape on the surface of a substrate to be cleaned, by shifting a weight along the arm, based on at least one of the following; the amount of tape being moved from the tape supply reel to the tape take up reel and a sensor detecting the pressing force of the tape on the surface of the substrate.

17. A method for cleaning a partial area of a substrate, in particular a photomask, the method comprising:
 providing a cleaning head having a lower surface, the lower surface having a central opening formed therein, a first annular groove, surrounding the central opening, and at least a second groove, arranged between the first annular groove and the central opening;
 providing a tape supply mechanism arranged to supply an abrasive tape to the central opening in the lower surface of the cleaning head, such that a portion of the abrasive tape protrudes therefrom;
 placing the protruding portion of the abrasive tape in contact with the area of the substrate to be cleaned to thereby bring the lower surface of the cleaning head in close proximity to the substrate area to be cleaned;
 supplying a liquid to a backside of the abrasive tape at or at the vicinity of the central opening, such that at least the portion of the abrasive tape protruding from the central opening is wetted;
 causing a relative movement between the abrasive tape and the surface area of the substrate to be cleaned;
 applying a cleaning fluid to the substrate area to be cleaned via the at least one first groove or the at least one second groove; and
 applying a suction force to the other groove, i.e. the at least one second groove or the at least one first groove.

18. The method of claim 17, wherein the amount of protrusion defines the gap between the substrate surface and the lower surface of the cleaning head.

19. The method of claim 17, wherein the cleaning fluid is a liquid media, the liquid media being applied via the second port and the suction force being applied to the first port.

20. The method of claim 17, wherein the cleaning fluid is a liquid media, the liquid media being applied via the first port and the suction force being applied to the second port.

21. The method of claim 17, wherein the force of the abrasive tape acting on the substrate is controlled to be between 0.1 N and 5N, preferably about 1 N.

22. The method of claim 17, wherein causing a relative movement between the abrasive tape and the surface area of the substrate to be cleaned includes at least one of the following: moving the tape between a tape supply reel and a tape take up reel and moving the cleaning head along a predetermined path.

23. The method of claim 22, wherein the cleaning head is moved along a linear path, which is aligned with the direction of extension of the protruding portion of the tape.

24. The method of claim 22, wherein both the tape and the cleaning head are being moved, and wherein a tape supply mechanism for moving the tape and a moving mechanism for moving the cleaning head are controlled in a manner such that a movement speed of the tape is synchronized with a movement speed of the cleaning head.

25. The method claim 17, comprising a balancing apparatus configured to provide a constant pressing force of the tape on the surface of a substrate to be cleaned, by shifting a weight along the arm, based on at least one of the following: an amount of tape being moved from a tape supply reel to a tape take up reel and a sensor detecting the pressing force of the tape on the surface of the substrate.

26. The method of claim 17, wherein the substrate is a photomask and the method is used to remove glue, in particular a pellicle glue line, from the photomask.

* * * * *